United States Patent
Lee

(10) Patent No.: US 9,859,869 B1
(45) Date of Patent: Jan. 2, 2018

(54) OUTPUT CIRCUIT USING CALIBRATION CIRCUIT, AND SEMICONDUCTOR DEVICE AND SYSTEM INCLUDING THE SAME

(71) Applicant: SK hynix Inc., Icheon-si, Gyeonggi-do (KR)

(72) Inventor: Kwang Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/443,343

(22) Filed: Feb. 27, 2017

(30) Foreign Application Priority Data

Oct. 5, 2016 (KR) .................. 10-2016-0128405

(51) Int. Cl.
*H03K 19/00* (2006.01)
*H03K 19/0175* (2006.01)
*H03H 11/28* (2006.01)
*H03K 17/687* (2006.01)

(52) U.S. Cl.
CPC ......... *H03H 11/28* (2013.01); *H03K 17/6872* (2013.01); *H03K 19/0005* (2013.01); *H03K 19/017545* (2013.01)

(58) Field of Classification Search
None
See application file for complete search history.

(56) References Cited

U.S. PATENT DOCUMENTS

| 9,294,072 B2 | 3/2016 | Kaneko et al. | |
| 2010/0308861 A1* | 12/2010 | Lee | H04L 25/0278 326/30 |
| 2011/0074462 A1* | 3/2011 | Chung | H03K 19/0005 326/30 |
| 2013/0015879 A1* | 1/2013 | Araki | H03K 19/00369 326/30 |

FOREIGN PATENT DOCUMENTS

KR     1020120040775 A     4/2012

\* cited by examiner

*Primary Examiner* — Jany Richardson
(74) *Attorney, Agent, or Firm* — William Park & Associates Ltd.

(57) ABSTRACT

A semiconductor device may include a calibration circuit and an output circuit. The calibration circuit may generate a calibration code by performing an impedance calibration operation, and may generate a correction calibration code by inverting or maintaining logic levels of the calibration code based on the calibration code. The output circuit may generate an output signal based on an input signal and the correction calibration code.

17 Claims, 6 Drawing Sheets

US 9,859,869 B1

OUTPUT CIRCUIT USING CALIBRATION CIRCUIT, AND SEMICONDUCTOR DEVICE AND SYSTEM INCLUDING THE SAME

CROSS-REFERENCES TO RELATED APPLICATION

The present application claims priority under 35 U.S.C. §119(a) to Korean application number 10-2016-0128405 filed on Oct. 5, 2016, in the Korean Intellectual Property Office, which is incorporated herein by reference in its entirety.

BACKGROUND

1. Technical Field

Various embodiments generally relate to a semiconductor technology, and, more particularly, to an output circuit using a calibration circuit, and a semiconductor device and system including the same.

2. Related Art

An electronic apparatus such as a computer system may include a large number of electronic components. The computer system may include many semiconductor devices, which are semiconductor based electronic components. Such semiconductor devices may transmit data in synchronization with a clock, and may perform serial communication. As semiconductor devices operate with low signal voltages and high operating frequencies, electronic signals may be distorted due to the influence of noise when they are transmitted via signal lines, and impedance mismatching between semiconductor devices communicating with each other may lead to signal distortion.

In order to avoid such signal distortion, a semiconductor device may include an on-die termination circuit which performs impedance matching for signal integrity purposes. Moreover, the semiconductor device may perform an impedance calibration of termination resistance according to PVT variations for the purpose of precise impedance matching. In general, a memory device may be coupled to an external reference resistor, and calibrates the impedance value of termination resistance by performing a calibration operation by using the external reference resistor. This is generally referred to as a ZQ calibration operation.

SUMMARY

In an embodiment, a semiconductor device may include a calibration circuit and an output circuit. The calibration circuit may generate an impedance calibration code by performing a calibration operation, and may generate a correction calibration code by inverting or maintaining logic levels of the calibration code based on the calibration code. The output circuit may generate an output signal based on an input signal and the correction calibration code.

In an embodiment, a semiconductor device may include a calibrator, a code controller, and an output circuit. The calibrator may generate a pull-up calibration code and a pull-down calibration code by performing an impedance calibration operation. The code controller may generate a pull-up correction calibration code and a pull-down correction calibration code by inverting or maintaining a logic level of at least one of the pull-up calibration code and the pull-down calibration code. The output circuit may generate an output signal based on an input signal, the pull-up correction calibration code, and the pull-down correction calibration code.

DETAILED DESCRIPTION

Hereinafter, an output circuit using a calibration circuit, and a semiconductor device and system including the same will be described below with reference to the accompanying drawings through various examples of embodiments.

Figure 1:
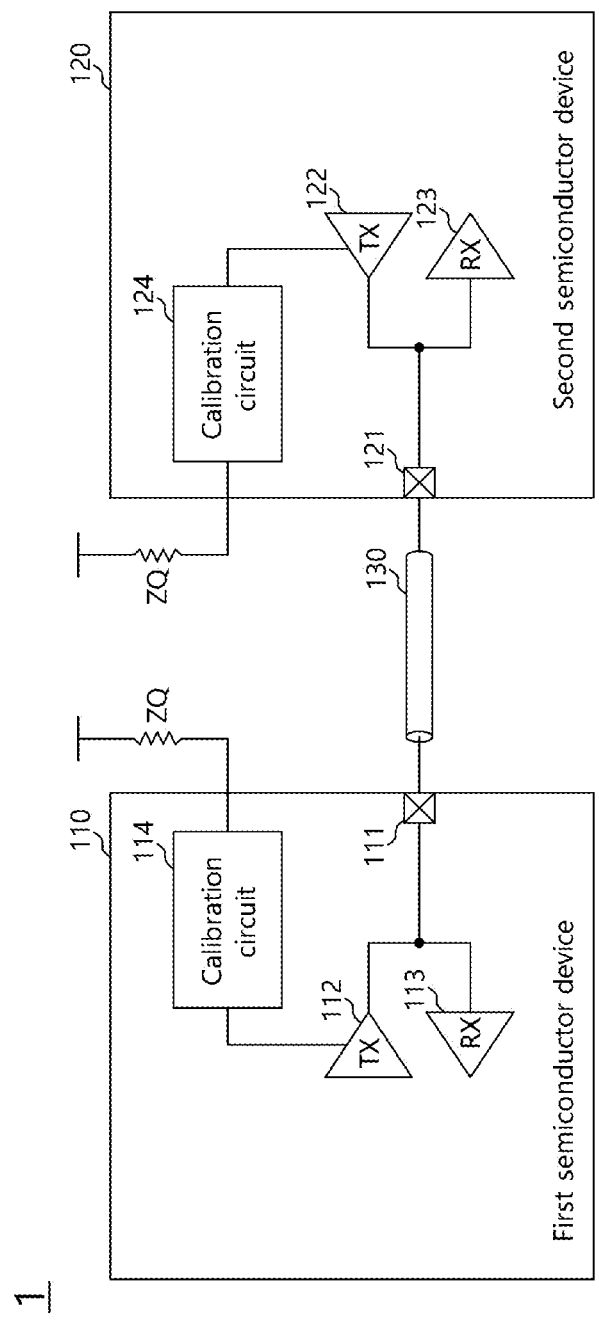
FIG. 1 is a diagram illustrating an example of a system in accordance with an embodiment.

FIG. 1 is a diagram illustrating an example of a semiconductor system 1 in accordance with an embodiment. In FIG. 1, the semiconductor system 1 in accordance with an embodiment may include a first semiconductor device 110 and a second semiconductor device 120. The first semiconductor device 110 and the second semiconductor device 120 may be electronic components that communicate with each other. In an embodiment, the first semiconductor device 110 may be a master device, and the second semiconductor device 120 may be a slave device that is controlled by the first semiconductor device 110. For example, the first semiconductor device 110 may be a host device such as a processor or a controller, and may include one or more of a central processing unit (CPU), a graphic processing unit (GPU), a multimedia processor (MMP), a digital signal processor (DSP), and a memory controller. Furthermore, the first semiconductor device 110 may be realized in the form of a system-on-chip by integrating various processor chips having various functions, such as application processors (AP), into a single chip. The second semiconductor device 120 may be a memory device, and the memory device may include a volatile memory and a nonvolatile memory. The volatile memory may include a static RAM (SRAM), a dynamic RAM (DRAM) or a synchronous DRAM (SDRAM), and the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM) or a ferroelectric RAM (FRAM).

The first and second semiconductor devices 110 and 120 may be coupled to each other through a signal transmission line 130. The first semiconductor device 110 may include a pad 111, and the pad 111 may be coupled to the signal transmission line 130. The second semiconductor device 120 may include a pad 121, and the pad 121 may be coupled to the signal transmission line 130. Here, the pads 111 and 121 are conductor portions of the semiconductor devices provided to make an electrical connection to an external element. The signal transmission line 130 may be a channel, a link or a bus. Although the signal transmission line 130 is illustrated as a transmission line that transmits data, it is to be noted that the embodiment is not limited thereto, and the signal transmission line 130 may transmit a clock signal, a command signal or an address signal. The first semiconductor device 110 may include a transmitting device 112 and a receiving device 113. The transmitting device 112 may generate an output signal and transmit the output signal to the second semiconductor device 120 through the signal transmission line 130. The receiving device 113 may receive a signal transmitted from the second semiconductor device 120 through the signal transmission line 130. Similarly, the second semiconductor device 120 may include a transmitting device 122 and a receiving device 123. The transmitting device 122 may generate an output signal and transmit the output signal to the first semiconductor device 110 through the signal transmission line 130. The receiving device 123 may receive a signal transmitted from the first semiconductor device 110 through the signal transmission line 130.

The first and second semiconductor devices 110 and 120 may further include calibration circuits 114 and 124. The calibration circuits 114 and 124 may perform impedance calibration operations using external reference resistors ZQ coupled thereto. While not illustrated, the calibration circuits 114 and 124 may be coupled to the external reference resistors ZQ through pads, respectively. The calibration circuits 114 and 124 may set the resistance values of the transmitting devices 112 and 122 through the impedance calibration operations. For example, the resistance values of the transmitting devices 112 and 122 may be set to 60 ohms, 120 ohms or 240 ohms depending on the results of the impedance calibration operations. The calibration circuits 114 and 124 may generate calibration codes by using the external reference resistors ZQ. The transmitting devices 112 and 122 may set their resistance values based on the calibration codes.

Figure 2:
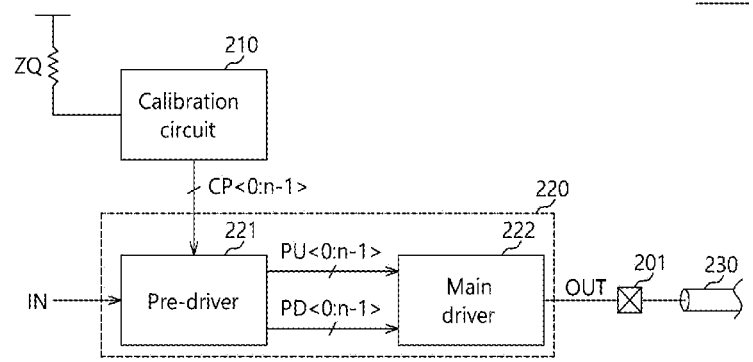
FIG. 2 is a diagram illustrating an example of a semiconductor device in accordance with an embodiment.

FIG. 2 is a diagram illustrating an example of a semiconductor device 200 in accordance with an embodiment. The semiconductor device 200 may include a calibration circuit 210 and an output circuit 220. The concept of the calibration circuit 210 may be applied to one or both of the calibration circuits 114 and 124 illustrated in FIG. 1, and the concept of the output circuit 220 may be applied to one or both of the transmitting devices 112 and 122 illustrated in FIG. 1. The calibration circuit 210 may perform an impedance calibration operation by using an external reference resistor ZQ coupled thereto. The calibration circuit 210 may generate a calibration code by using the external reference resistor ZQ, and may generate a correction calibration code CP<0:n−1> based on the calibration code. The calibration circuit 210 may generate the correction calibration code CP<0:n−1> from the calibration code to minimize power consumption in the output circuit 220 and in the semiconductor device 200. For example, the calibration circuit 210 may generate the correction calibration code CP<0:n−1> based on the calibration code to minimize the number of logic-high bits in the correction calibration code CP<0:n−1>. For example, the calibration circuit 210 may generate the correction calibration code CP<0:n−1> by inverting the calibration code when a predetermined number of bits among the bits of the calibration code are at a first level. Here, the first level may be a logic high level. Conversely, the calibration circuit 210 may generate the correction calibration code CP<0:n−1> by maintaining logic levels of the calibration code when the number of first-level bits among the bits of the calibration code does not reach the predetermined number.

The output circuit 220 may generate an output signal OUT based on an input signal IN and the correction calibration code CP<0:n−1>. The input signal IN may include a certain signal that is generated by an internal circuit of the semiconductor device 200 and is transmitted to an external device as the output signal OUT. For example, each of the input signal IN and the output signal OUT may include data, a command signal, an address signal, and/or a clock signal. The output circuit 220 may include a pre-driver 221 and a main driver 222. The pre-driver 221 may receive the input signal IN and the correction calibration code CP<0:n−1>. The pre-driver 221 may generate a pull-up code PU<0:n−1> and a pull-down code PD<0:n−1> by combining the input signal IN and the correction calibration code CP<0:n−1>. Each of the pull-up code PU<0:n−1> and the pull-down code PD<0:n−1> may include a plurality of bits.

The main driver 222 may be coupled to a signal transmission line 230 through a pad 201. The main driver 222 may receive the pull-up code PU<0:n−1> and the pull-down code PD<0:n−1>. The resistance value of the main driver 222 may be set based on the pull-up code PU<0:n−1> and the pull-down code PD<0:n−1>. The main driver 222 may generate the output signal OUT based on the pull-up code PU<0:n−1> and the pull-down code PD<0:n−1>. The main driver 222 may drive the pad 201 and the signal transmission line 230 based on the pull-up code PU<0:n−1> and the pull-down code PD<0:n−1>. The signal transmission line 230 may be driven to a level corresponding to the input signal IN by the main driver 222.

Figure 3:
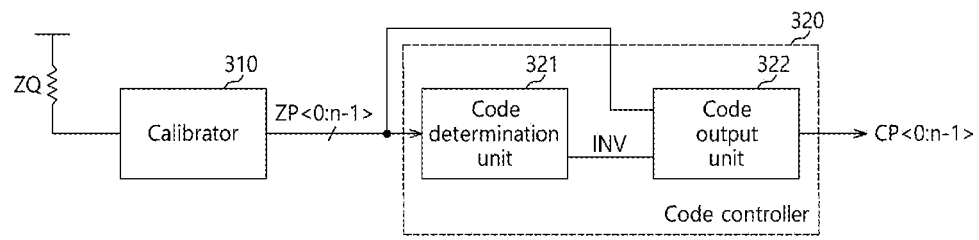
FIG. 3 is a diagram illustrating an example of the calibration circuit illustrated in FIG. 2.

FIG. 3 is a diagram illustrating an example of the calibration circuit 210 illustrated in FIG. 2. In FIG. 3, the calibration circuit 210 may include a calibrator 310 and a code controller 320. The calibrator 310 may be coupled to the external reference resistor ZQ and generate a calibration code ZP<0:n−1>. As will be described later, the calibration code ZP<0:n−1> may include a pull-up calibration code and a pull-down calibration code. The code controller 320 may receive the calibration code ZP<0:n−1> and generate the correction calibration code CP<0:n−1> based on the calibration code ZP<0:n−1>. The correction calibration code CP<0:n−1> may include a pull-up correction calibration code and a pull-down correction calibration code.

The code controller 320 may generate the correction calibration code CP<0:n−1> based on the calibration code ZP<0:n−1>. The code controller 320 may generate the correction calibration code CP<0:n−1> by inverting the calibration code ZP<0:n−1>, or may generate the correction calibration code CP<0:n−1> by maintaining logic levels of the calibration code ZP<0:n−1>. The code controller 320 may generate the correction calibration code CP<0:n−1> by inverting the calibration code ZP<0:n−1> when the predetermined number of bits among the bits of the calibration code ZP<0:n−1> are at the first level. The code controller 320 may generate the correction calibration code CP<0:n−1> by maintaining the logic levels of the calibration code ZP<0:n−1> when the number of the first-level bits among the bits of the calibration code ZP<0:n−1> does not reach the predetermined number.

In FIG. 3, the code controller 320 may include a code determination circuit 321 and a code output circuit 322. The code determination circuit 321 may receive the calibration code ZP<0:n−1> and generate an inversion signal INV based on the calibration code ZP<0:n−1>. The code determination circuit 321 may enable the inversion signal INV if the number of the first-level bits among the bits of the calibration code ZP<0:n−1> reaches the predetermined number. The code determination circuit 321 may disable the inversion signal INV when the number of the first-level bits among the bits of the calibration code ZP<0:n−1> does not reach the predetermined number. The code determination circuit 321 may generate the inversion signal INV by performing a logical operation on a predetermined order bit of the calibration code ZP<0:n−1> and one or more bits lower than the predetermined order bit. Here, the predetermined order bit may be a bit in a predetermined bit order position. The code determination circuit 321 may enable the inversion signal INV, for example, when the predetermined order bit is at a second level and the lower bits are at the first level.

The code output circuit 322 may output the correction calibration code CP<0:n−1> by inverting the calibration code ZP<0:n−1> in response to the inversion signal INV enabled. The code output circuit 322 may output the correction calibration code CP<0:n−1> by maintaining the logic levels of the calibration code ZP<0:n−1> in response to the inversion signal INV disabled.

Figure 4:
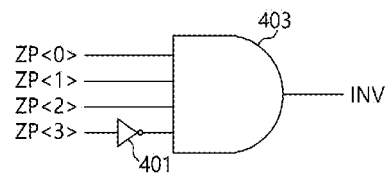
FIG. 4 is a diagram illustrating an example of the code determination circuit illustrated in FIG. 3.

FIG. 4 is a diagram illustrating an example of the code determination circuit 321 illustrated in FIG. 3. In FIG. 4, the code determination circuit 321 may include an inversion logic 401 and an AND logic 403. The inversion logic 401 may receive the predetermined order bit of the calibration code ZP<0:n−1> and invert the logic value of the predetermined order bit, and may output the inverted logic value of the certain bit. The inversion logic 401 may include an inverter that receives the predetermined order bit. The AND logic 403 may receive the output of the inversion logic 401 and all the bits in lower order bit positions than the predetermined order bit. In an embodiment, the AND logic 403 may receive all bits in higher order bit positions than the predetermined order bit. The AND logic 403 may perform an AND operation on the output of the inversion logic 401 and the bits in the lower order bit positions than the predetermined order bit, and may generate the inversion signal INV. The predetermined order bit may be selected depending on what the predetermined number is. For example, in the case where the calibration code ZP<0:n−1> consists of four bits, the predetermined order bit may be a most significant bit. When the predetermined order bit is the most significant bit, the inversion logic 401 may receive the most significant bit ZP<3> of the calibration code ZP<0:3>, and the AND logic 403 may receive the output of the inversion logic 401 and the bits ZP<0>, ZP<1> and ZP<2> in lower order bit positions than the most significant bit ZP<3>. For example, when the calibration code ZP<0:3> is "0, 1, 1, 1," the code determination circuit 321 may enable the inversion signal INV. When the calibration code ZP<0: 3> is "0, 0, 1, 1" or "0, 0, 0, 1," the code determination circuit 321 may disable the inversion signal INV. The code determination circuit 321 may generate the inversion signal INV in such a way as to minimize the number of first-level bits among the bits of the calibration code ZP<0:3>. In particular, in the case where the code determination circuit 321 inverts the calibration code ZP<0:3> when the calibration code ZP<0:3> is "1, 1, 1, 1," because the correction calibration code CP<0:3> has the value of "0, 0, 0, 0," the resistance value of the main driver 222 may not be set. Therefore, the inversion logic 401 receiving the predetermined order bit ZP<3> may disable the inversion signal INV when the value of the predetermined order bit ZP<3> is at the first level.

Figure 5:
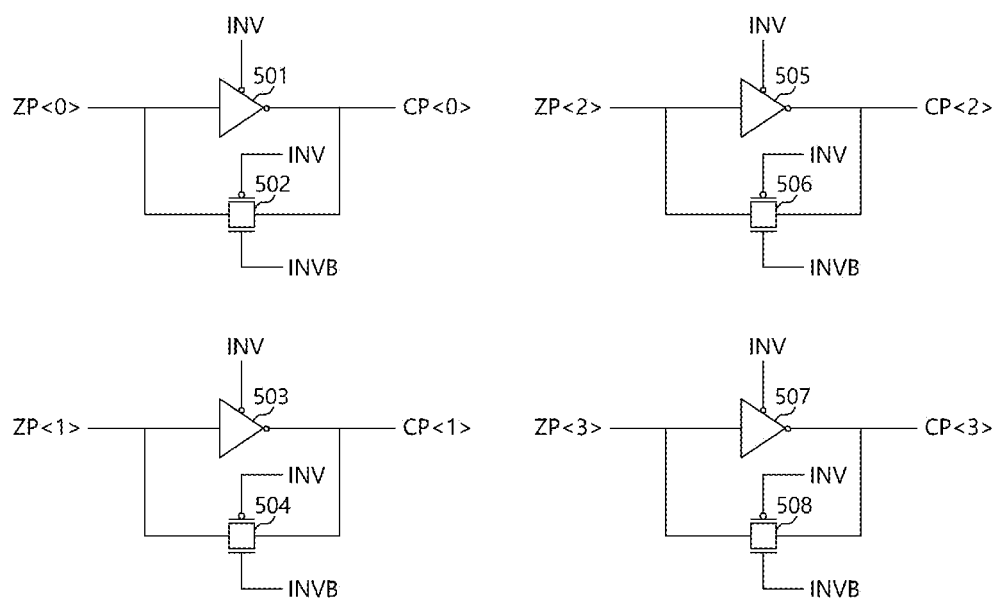
FIG. 5 is a diagram illustrating an example of the code output circuit illustrated in FIG. 3.

FIG. 5 is a diagram illustrating an example of the code output circuit 322 illustrated in FIG. 3. In FIG. 5, the code output circuit 322 may include a plurality of inverters and a plurality of pass gates that receive the respective bits of the calibration code ZP<0:n−1>. Similarly to FIG. 4, an example where the calibration code ZP<0:n−1> has four bits will be discussed. A first inverter 501, a second inverter 503, a third inverter 505 and a fourth inverter 507 may invert the respective bits of the calibration code ZP<0:3> in response to the inversion signal INV enabled, and output resultant signals. A first pass gate 502, a second pass gate 504, a third pass gate 506, and a fourth pass gate 508 may not invert the respective bits of the calibration code ZP<0:3> in response to the inversion signal INV disabled, and may output resultant signals. When the inversion signal INV is enabled, the first to fourth inverters 501, 503, 505, and 507 may be turned on, and the first to fourth pass gates 502, 504, 506, and 508 may be turned off. Accordingly, the calibration code ZP<0: 3> may be inverted through the first to fourth inverters 501, 503, 505, and 507, and the inverted calibration code may be output as the correction calibration code CP<0:3>. When the inversion signal INV is disabled, the first to fourth inverters 501, 503, 505, and 507 may be turned off, and the first to fourth pass gates 502, 504, 506, and 508 may be turned on. Accordingly, the calibration code ZP<0:3> may be output through the first to fourth pass gates 502, 504, 506, and 508 while maintaining its logic level, and the calibration code ZP<0:3> may be outputted as the correction calibration code CP<0:3> as it is.

Figure 6A:
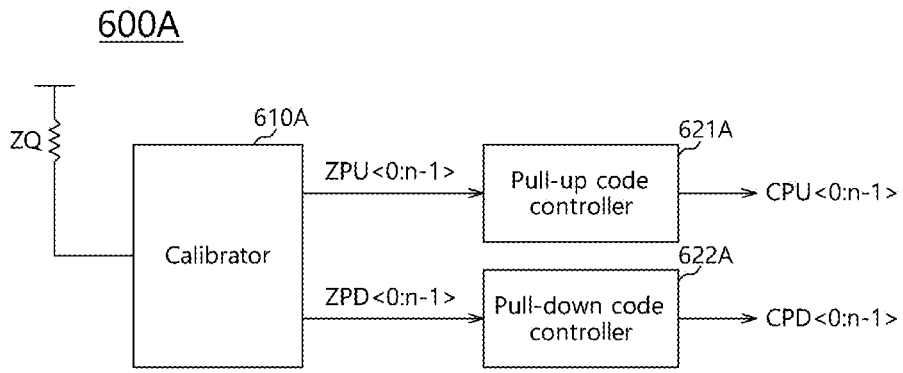
FIGS. 6A, 6B and 6C are diagrams illustrating examples of calibration circuits in accordance with embodiments.
Figure 6B:
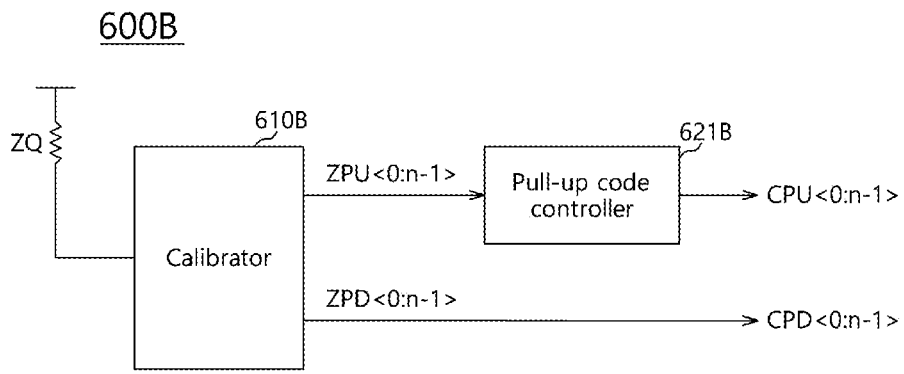
Figure 6C:
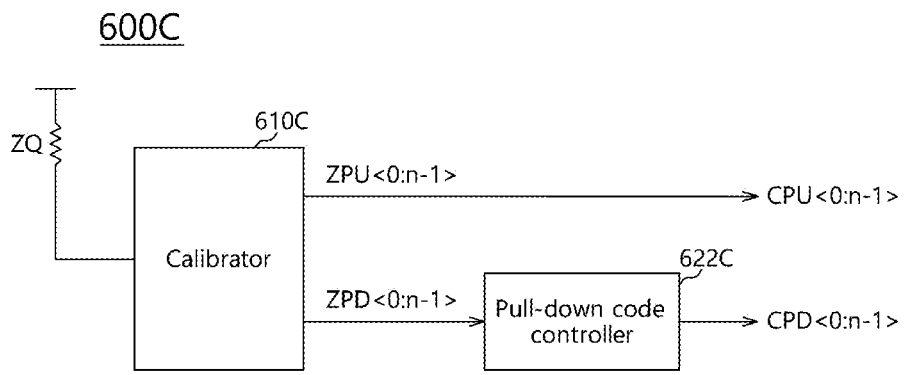

FIGS. 6A to 6C are diagrams illustrating examples of calibration circuits 600A, 600B, and 600C in accordance with embodiments. The concept of each calibration circuit 600A, 600B or 600C illustrated in FIGS. 6A to 6C may be applied to the calibration circuit 210 illustrated in FIG. 2. The calibration code ZP<0:n−1> may include a pull-up calibration code ZPU<0:n−1> and a pull-down calibration code ZPD<0:n−1>. The correction calibration code CP<0: n−1> may include a pull-up correction calibration code CPU<0:n−1> and a pull-down correction calibration code CPD<0:n−1>. In FIG. 6A, the calibration circuit 600A may include a calibrator 610A, a pull-up code controller 621A, and a pull-down code controller 622A. The calibrator 610A may be coupled to an external reference resistor ZQ, and generate the pull-up calibration code ZPU<0:n−1> and the pull-down calibration code ZPD<0:n−1>. The calibration circuit 600A may selectively invert both the pull-up calibration code ZPU<0:n−1> and the pull-down calibration code ZPD<0:n−1>. The pull-up code controller 621A may generate the pull-up correction calibration code CPU<0:n−1> based on the pull-up calibration code ZPU<0:n−1>. For example, the pull-up code controller 621A may generate the pull-up correction calibration code CPU<0:n−1> by inverting the pull-up calibration code ZPU<0:n−1> or by maintaining the logic level of the pull-down calibration code ZPD<0:n−1>. The pull-down code controller 622A may generate the pull-down correction calibration code CPD<0: n−1> based on the pull-down calibration code ZPD<0:n−1>. For example, the pull-down code controller 622A may generate the pull-down correction calibration code CPD<0: n−1> by inverting the pull-down calibration code ZPD<0: n−1> or by maintaining the logic level of the pull-down calibration code ZPD<0:n−1>. The pull-up code controller 621A and the pull-down code controller 622A may have the same configuration as the code controller 320 illustrated in FIGS. 3 to 5, but input/output signals thereof may vary. As the calibration circuit 600A includes the pull-up code controller 621A and the pull-down code controller 622A, the calibration circuit 600A may selectively invert both the pull-up calibration code ZPU<0:n−1> and the pull-down calibration code ZPD<0:n−1>, and thus the power consumed in the output circuit 220 and the semiconductor device 200 may be minimized.

In FIG. 6B, the calibration circuit 600B may include a calibrator 610B and a pull-up code controller 621B. The calibration circuit 600B may selectively invert only the pull-up calibration code ZPU<0:n−1> between the pull-up calibration code ZPU<0:n−1> and the pull-down calibration code ZPD<0:n−1>. The pull-up code controller 621B may generate the pull-up correction calibration code CPU<0:n−1> based on the pull-up calibration code ZPU<0:n−1> generated from the calibrator 610B. For example, the pull-up code controller 621B may generate the pull-up correction calibration code CPU<0:n−1> by inverting the pull-up calibration code ZPU<0:n−1> or by maintaining the logic level of the pull-down calibration code ZPD<0:n−1>. The calibration circuit 600B may provide the pull-down calibration code ZPD<0:n−1> generated from the calibrator 610B, as the pull-down correction calibration code CPD<0:n−1>. In FIG. 6C, the calibration circuit 600C may include a calibrator 610C and a pull-down code controller 622C. The calibration circuit 600C may selectively invert only one selected between the pull-up calibration code ZPU<0:n−1> and the pull-down calibration code ZPD<0:n−1>. For example, the calibration circuit 600C may selectively invert only the pull-down calibration code ZPD<0:n−1>. The pull-down code controller 622C may generate the pull-down correction calibration code CPD<0:n−1> based on the pull-down calibration code ZPD<0:n−1> generated from the calibrator 610C. For example, the pull-down code controller 622C may generate the pull-down correction calibration code CPD<0:n−1> by inverting the pull-down calibration code ZPD<0:n−1> or by maintaining the logic level of the pull-down calibration code ZPD<0:n−1>. The calibration circuit 600C may provide the pull-up calibration code ZPU<0:n−1> generated from the calibrator 610C, as the pull-up correction calibration code CPU<0:n−1>. As will be described later, the main driver 222 may include a pull-up driver and a pull-down driver to generate the output signal OUT, and the resistance of the pull-up driver and the pull-down driver may be used as a termination resistance for the semiconductor device 200 to communicate with an external device. In order to precisely set the resistance values of pull-up and pull-down drivers that are used as the termination resistance, the calibration circuits 600B and 600C may provide a correction calibration code by maintaining the logic level of a calibration code that is provided for the purpose of setting the resistance value of any one of such pull-up and pull-down drivers (i.e., pull-up and pull-down drivers that are used as the termination resistance). Conversely, when setting the resistance values of pull-up and pull-down drivers that are not used as the termination resistance, a calibration code that is provided for the purpose of setting the resistance value of any one of such pull-up and pull-down drivers (i.e., pull-up and pull-down drivers that are not used as the termination resistance) may be selectively inverted. In the case where the inverted calibration code is used, the power consumed in the semiconductor device 200 may be reduced.

Figure 7:
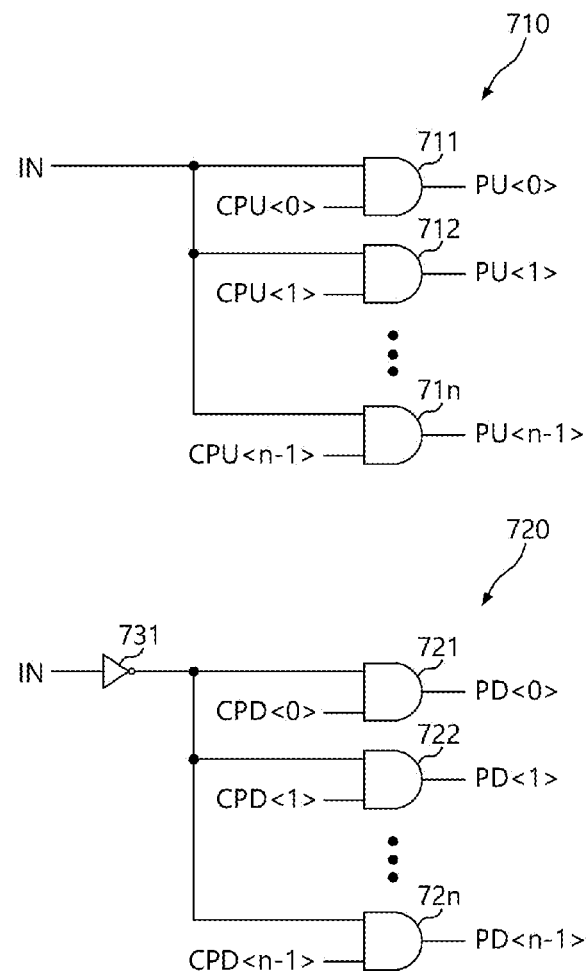
FIG. 7 is a diagram illustrating an example of the pre-driver illustrated in FIG. 2.

FIG. 7 is a diagram illustrating an example of the pre-driver 221 illustrated in FIG. 2. In FIG. 7, the pre-driver 221 may include a pull-up pre-driver 710 and a pull-down pre-driver 720. The pull-up pre-driver 710 may generate the pull-up code PU<0:n−1> based on the input signal IN and the pull-up correction calibration code CPU<0:n−1>. The pull-down pre-driver 720 may generate the pull-down code PD<0:n−1> based on the input signal IN and the pull-down correction calibration code CPD<0:n−1>. The pull-up pre-driver 710 may include a plurality of AND gates 711, 712, . . . , and 71n. The plurality of AND gates 711, 712, . . . , and 71n may receive, respectively, the bits allocated thereto among the bits of the pull-up correction calibration code CPU<0:n−1>, and may receive in common the input signal IN. The plurality of AND gates 711, 712, . . . , and 71n may generate the pull-up code PU<0:n−1> having the first level when the input signal IN is at the first level and the allocated bits are at the first level. The plurality of AND gates 711, 712, . . . , and 71n may generate the pull-up code PU<0:n−1> having the second level when the input signal IN is at the second level or the allocated bits are at the second level. The second level may be a logic low level.

The pull-down pre-driver 720 may include a plurality of AND gates 721, 722, . . . , and 72n and an inverter 731. The inverter 731 may invert the input signal IN and output a resultant signal. The plurality of AND gates 721, 722, . . . , and 72n may receive, respectively, the bits allocated thereto among the bits of the pull-down correction calibration code CPD<0:n−1>, and may receive in common the inverted signal of the input signal IN. The plurality of AND gates 721, 722, . . . , and 72n may generate the pull-down code PD<0:n−1> having the first level when the input signal IN is at the second level and the allocated bits are at the first level. The plurality of AND gates 721, 722, . . . , and 72n may generate the pull-down code PD<0:n−1> having the second level when the input signal IN is at the first level or the allocated bits are at the second level.

Figure 8:
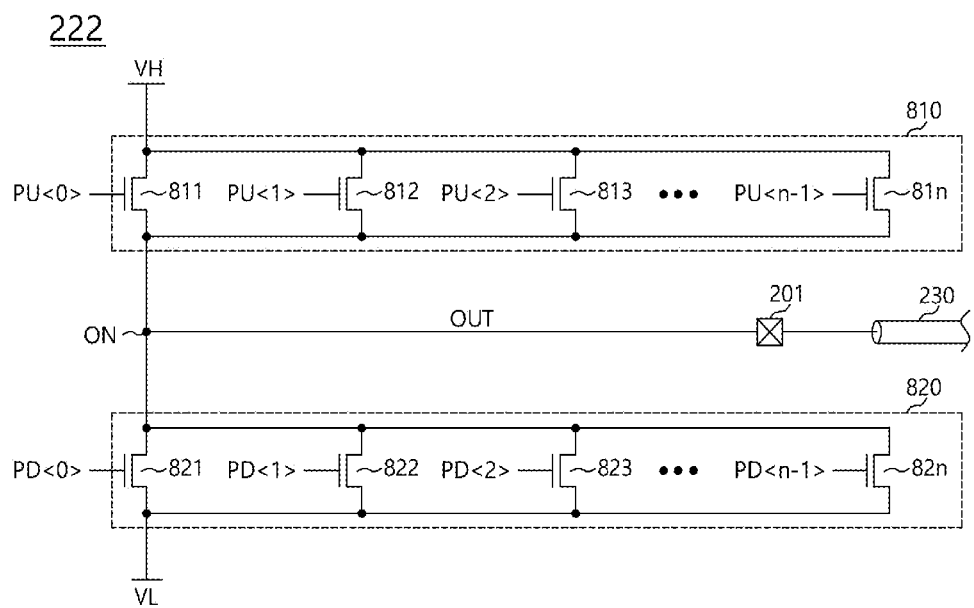
FIG. 8 is a diagram illustrating an example of the main driver illustrated in FIG. 2.

FIG. 8 is a diagram illustrating an example of the main driver 222 illustrated in FIG. 2. In FIG. 8, the main driver 222 may include a pull-up driver 810 and a pull-down driver 820. The pull-up driver 810 may be coupled between a voltage supply terminal of a first voltage VH and an output node ON. The first voltage VH may be a high voltage such as the power supply voltage of the main driver 222. The output node ON may be coupled to the pad 201 and the signal transmission line 230. The pull-up driver 810 may set its resistance value in response to the pull-up code PU<0:n−1>. The pull-up driver 810 may bring the voltage level at the output node ON up to the first voltage VH in response to the pull-up code PU<0:n−1>. The pull-down driver 820 may be coupled between the output node ON and the voltage supply terminal of a second voltage VL. The second voltage VL may be a low voltage such as a ground voltage. The pull-down driver 820 may set its resistance value in response to the pull-down code PD<0:n−1>. The pull-down driver 820 may bring the voltage level at the output node ON down to the second voltage VL in response to the pull-down code PD<0:n−1>. The pull-up driver 810 and the pull-down driver 820 may generate the output signal OUT by increasing or decreasing the voltage at the output node ON.

The pull-up driver 810 may include a plurality of transistors 811, 812, 813, . . . , and 81n. The plurality of transistors 811, 812, 813, . . . , and 81n may be N-channel MOS transistors. However, the plurality of transistors 811, 812, 813, . . . , and 81n may be P-channel MOS transistors. The pull-up driver 810 may include transistors the number of which corresponds to the number of bits of each of the pull-up correction calibration code CPU<0:n−1> and the pull-up code PU<0:n−1>. The first transistor 811 may have a gate receiving the pull-up code PU<0>, a drain coupled to the voltage supply terminal of the first voltage VH, and a source coupled to the output node ON. The second transistor 812 may have a gate receiving the pull-up code PU<1>, a drain coupled to the voltage supply terminal of the first voltage VH, and a source coupled to the output node ON.

The third transistor 813 may have a gate receiving the pull-up code PU<2>, a drain coupled to the voltage supply terminal of the first voltage VH, and a source coupled to the output node ON. The n^th transistor 81n may have a gate which receives the pull-up code PU<n−1>, a drain which is coupled with the terminal of the first voltage VH and a source which is coupled with the output node ON. The first to n^th transistors 811, 812, 813, . . . , and 81n may have different turn-on resistance values. For example, the first transistor 811 may have a largest turn-on resistance value, and the second to n^th transistors 812, 813, . . . , and 81n may have turn-on resistance values that decrease sequentially. In other words, the n^th transistor 81n may have the largest current driving force, and the (n−1)^th to first transistors 81(n−1), . . . , 813, 812, and 811 may have current driving forces that decrease sequentially.

The pull-down driver 820 may include a plurality of transistors 821, 822, 823, . . . , and 82n. The plurality of transistors 821, 822, 823, . . . , and 82n may be N-channel MOS transistors. However, the plurality of transistors 821, 822, 823, . . . , and 82n may be P-channel MOS transistors. The pull-down driver 820 may include transistors the number of which corresponds to the number of bits of each of the pull-down correction calibration code CPD<0:n−1> and the pull-down code PD<0:n−1>. The first transistor 821 may have a gate receiving the pull-down code PD<0>, a drain coupled to the output node ON, and a source coupled to the voltage supply terminal of the second voltage VL. The second transistor 822 may have a gate receiving the pull-down code PD<1>, a drain coupled to the output node ON, and a source coupled to the voltage supply terminal of the second voltage VL. The third transistor 823 may have a gate receiving the pull-down code PD<2>, a drain coupled to the output node ON, and a source coupled to the voltage supply terminal of the second voltage VL. The n^th transistor 82n may have a gate receiving the pull-down code PD<n−1>, a drain coupled to the output node ON, and a source coupled to the voltage supply terminal of the second voltage VL. The first to n^th transistors 821, 822, 823, . . . , and 82n may have different turn-on resistance values. For example, the first transistor 821 may have the largest turn-on resistance value, and the second to n^th transistors 822, 823, . . . , and 82n may have turn-on resistance values that decrease sequentially.

The operation of the semiconductor device 200 in accordance with an embodiment will be described below with reference to FIGS. 2 to 8. The calibration circuit 210 may perform the impedance calibration operation by being coupled to the external reference resistor ZQ. The calibration circuit 210 may generate the pull-up calibration code ZPU<0:n−1> and the pull-down calibration code ZPD<0:n−1> through the impedance calibration operation. Here, an example where the values of the pull-up calibration code ZPU<0:n−1> and the pull-down calibration code ZPD<0:n−1> are "0, 1, 1, 1" will be discussed. When each of the pull-up calibration code ZPU<0:n−1> and the pull-down calibration code ZPD<0:n−1> has four bits, each of the pull-up driver 810 and the pull-down driver 820 may have four transistors. When the pull-up code PU<0:n−1> and the pull-down code PD<0:n−1> are generated based on the pull-up calibration code ZPU<0:n−1> and the pull-down calibration code ZPD<0:n−1>, three transistors out of the four transistors constituting the pull-up driver 810 may be turned on, or three transistors out of the four transistors constituting the pull-down driver 820 may be turned on. Thus, as a larger number of transistors are turned on, the power consumed by the output circuit 220 and the semiconductor device 200 may increase. In an embodiment of the present disclosure, the code controller 320 may invert the pull-up calibration code ZPU<0:n−1> and the pull-down calibration code ZPD<0:n−1> when at least the predetermined number of bits among the bits of the pull-up calibration code ZPU<0:n−1> and the pull-down calibration code ZPD<0:n−1> have the first level.

When the calibration circuit 600A shown in FIG. 6A is applied as the calibration circuit 210, the pull-up code controller 621A may invert the pull-up calibration code ZPU<0:n−1> and generate the pull-up correction calibration code CPU<0:n−1> having the value of "1, 0, 0, 0." Also, the pull-down code controller 622A may invert the pull-down calibration code ZPD<0:n−1> and generate the pull-down correction calibration code CPD<0:n−1> having the value of "1, 0, 0, 0." In the case where the pull-up code PU<0:n−1> and the pull-down code PD<0:n−1> are generated based on the pull-up correction calibration code CPU<0:n−1> and the pull-down correction calibration code CPD<0:n−1>, only one transistor out of the four transistors constituting the pull-up driver 810 may be turned on, or only one transistor out of the four transistors constituting the pull-down driver 820 may be turned on. Therefore, the number of transistors to be turned on by the correction calibration code CP<0:n−1> may be decreased, and the power consumed by the output circuit 220 and the semiconductor device 200 may be reduced significantly.

As described above, the transistors constituting each of the pull-up driver 810 and the pull-down driver 820 may have different turn-on resistance values. Therefore, a difference may exist between the resistance value set as three transistors are turned on in response to the three lower bits of the pull-up code PU<0:n−1> or the pull-down code PD<0:n−1> and the resistance value set as one transistor is turned on in response to the most significant bit of the pull-up code PU<0:n−1> or the pull-down code PD<0:n−1>. However, since the turn-on resistance value of a transistor that receives an upper bit of the pull-up code PU<0:n−1> or the pull-down code PD<0:n−1> is smaller than the turn-on resistance value of a transistor that receives a lower bit of the pull-up code PU<0:n−1> or the pull-down code PD<0:n−1>, the difference in resistance value may be minimized. When precise resistance value setting is needed to use the pull-up driver 810 or the pull-down driver 820 as a termination resistor, like the calibration circuits 600B and 600C shown in FIGS. 6B and 6C, any one of the pull-up code controller 621B and the pull-down code controller 622C may be used, and the pull-up calibration code ZPU<0:n−1> or the pull-down calibration code ZPD<0:n−1> may be used as it is, without inversion of signal polarity. While it is described above that the predetermined order bit corresponds to the most significant bit, it is to be noted that the present disclosure is not limited thereto. The calibration code ZP<0:n−1> may have at least five bits, and any bit can be the predetermined order bit. Depending on the resistance values of transistors constituting the pull-up driver 810 and the pull-down driver 820, a lower bit may be determined as the predetermined order bit instead of an upper bit.

While various embodiments have been described above, it will be understood to those skilled in the art that the embodiments described are examples only. Accordingly, the output circuit using a calibration circuit, and the semiconductor device and system including the same described herein should not be limited based on the described embodiments.

What is claimed is:

1. A semiconductor device comprising:
a calibration circuit configured to generate a calibration code by performing an impedance calibration operation, the calibration circuit being configured to generate a correction calibration code by inverting or maintaining logic levels of the calibration code based on the calibration code; and
an output circuit configured to generate an output signal based on an input signal and the correction calibration code.

2. The semiconductor device according to claim 1, wherein the calibration circuit comprises:
a calibrator configured to generate the calibration code by using an external reference resistor; and
a code controller configured to generate the correction calibration code by inverting or maintaining logic levels of the calibration code based on a determination whether a predetermined number of bits among bits of the calibration code are at a first level.

3. The semiconductor device according to claim 2, wherein the code controller comprises:
a code determination circuit configured to enable an inversion signal when the predetermined number of bits among the bits of the calibration code are at the first level, the code determination circuit being configured to disable the inversion signal when the number of the first-level bits of the calibration code is less than the predetermined number; and
a code output circuit configured to generate the correction calibration code by inverting the calibration code based on the enabled inversion signal, the code output circuit being configured to provide the calibration code as the correction calibration code based on the disabled inversion signal.

4. The semiconductor device according to claim 3, wherein the code determination circuit generates the inversion signal by performing a logical operation on a predetermined order bit and one or more bits in lower order bit positions than the predetermined order bit.

5. The semiconductor device according to claim 4, wherein the code determination circuit enables the inversion signal when the predetermined order bit is at a second level and the one or more bit in lower order bit positions than the predetermined order bit are at the first level.

6. The semiconductor device according to claim 4, wherein the code determination circuit disables the inversion signal when the predetermined order bit is at the first level.

7. The semiconductor device according to claim 3, wherein the code determination circuit comprises:
an inversion logic configured to invert a predetermined order bit in the calibration code; and
an AND logic configured to perform an AND operation on an output of the inversion logic and one or more bit in lower order bit positions than the predetermined order bit, the AND logic generating the inversion signal.

8. The semiconductor device according to claim 1, wherein the output circuit comprises:
a pre-driver configured to generate a pull-up code and a pull-down code based on the input signal and the correction calibration code; and
a main driver configured to generate the output signal based on the pull-up code and the pull-down code.

9. The semiconductor device according to claim 8, wherein the main driver comprises:

a pull-up driver configured to set its resistance value based on the pull-up code and drive an output node to a first voltage; and
a pull-down driver configured to be set in its resistance value based on the pull-down code and drive the output node to a second voltage.

10. A semiconductor device comprising:
a calibrator configured to generate a pull-up calibration code and a pull-down calibration code by performing an impedance calibration operation;
a code controller configured to generate a pull-up correction calibration code and a pull-down correction calibration code by inverting or maintaining a logic level of at least one of the pull-up calibration code and the pull-down calibration code; and
an output circuit configured to generate an output signal based on an input signal, the pull-up correction calibration code, and the pull-down correction calibration code.

11. The semiconductor device according to claim 10, wherein the code controller comprises:
a pull-up code controller configured to generate the pull-up correction calibration code by inverting or maintaining logic levels of the pull-up calibration code based on the pull-up calibration code; and
a pull-down code controller configured to generate the pull-down correction calibration code by inverting or maintaining logic levels of the pull-down calibration code based on the pull-down calibration code.

12. The semiconductor device according to claim 10, wherein the code controller comprises a pull-up code controller configured to generate the pull-up correction calibration code by inverting or maintaining logic levels of the pull-up calibration code based on the pull-up calibration code, and wherein the pull-down calibration code is provided as the pull-down correction calibration code.

13. The semiconductor device according to claim 10, wherein the code controller comprises a pull-down code controller configured to generate the pull-down correction calibration code by inverting or maintaining logic levels of the pull-down calibration code based on the pull-down calibration code, and wherein the pull-up calibration code is provided as the pull-up correction calibration code.

14. The semiconductor device according to claim 11, wherein the pull-up code controller comprises:
a code determination circuit configured to enable an inversion signal when a predetermined number of bits among bits of the pull-up calibration code are at a first level, the code determination circuit being configured to disable the inversion signal when the number of the first-level bits of the pull-up calibration code is less than the predetermined number; and
a code output circuit configured to generate the pull-up correction calibration code by inverting the pull-up calibration code based on the enabled inversion signal, the code output circuit being configured to provide the pull-up calibration code as the pull-up correction calibration code based on the disabled inversion signal.

15. The semiconductor device according to claim 11, wherein the pull-down code controller comprises:
a code determination circuit configured to enable an inversion signal when a predetermined number of bits among bits of the pull-down calibration code are at a first level, the code determination circuit being configured to disable the inversion signal when the number of the first-level bits of the pull-down calibration code is less than the predetermined number; and a code output circuit configured to generate the pull-down correction calibration code by inverting the pull-down calibration code based on the enabled inversion signal, the code output circuit being configured to provide the pull-down calibration code as the pull-down correction calibration code based on the disabled inversion signal.

16. The semiconductor device according to claim 10, wherein the output circuit comprises:
   a pre-driver configured to generate a pull-up code and a pull-down code based on the input signal, the pull-up correction calibration code, and the pull-down correction calibration code; and
   a main driver configured to generate the output signal based on the pull-up code and the pull-down code.

17. The semiconductor device according to claim 16, wherein the main driver comprises:
   a pull-up driver configured to set its resistance value based on the pull-up code, the pull-up driver being configured to drive an output node to a first voltage; and
   a pull-down driver configured to set its resistance value based on the pull-down code, the pull-down driver being configured to drive the output node to a second voltage.

* * * * *